United States Patent [19]
Yasutake et al.

[11] Patent Number: 5,134,398
[45] Date of Patent: Jul. 28, 1992

[54] DIGITAL-TO-ANALOG CONVERTER HAVING A CIRCUIT FOR COMPENSATING FOR VARIATION IN OUTPUT DEPENDENT ON TEMPERATURE CHANGE

[75] Inventors: Nobuyuki Yasutake, Tokyo; Hidefumi Yabara, Yokohama, both of Japan

[73] Assignee: Fujitsu Limited, Kawasaki, Japan

[21] Appl. No.: 671,228

[22] Filed: Mar. 19, 1991

[30] Foreign Application Priority Data

Mar. 20, 1990 [JP] Japan ................................. 2-70684

[51] Int. Cl.⁵ .................. H03M 1/06; H03M 1/78
[52] U.S. Cl. ............................ 341/119; 341/133; 341/154
[58] Field of Search .......... 341/119, 118, 154, 144, 341/133; 307/591, 310

[56] References Cited

U.S. PATENT DOCUMENTS

| | | | |
|---|---|---|---|
| 3,842,412 | 10/1974 | Spofford, Jr. | 341/119 |
| 3,932,863 | 1/1976 | Pastoriza | 341/119 X |
| 3,940,760 | 2/1976 | Brokaw | 341/119 |
| 4,176,344 | 11/1979 | Saari et al. | 341/119 |

*Primary Examiner*—Sharon D. Logan
*Attorney, Agent, or Firm*—Armstrong, Nikaido, Marmelstein, Kubovcik & Murray

[57] ABSTRACT

A D/A converter converting a digital signal having n bits (n is an integer) into an analog signal includes constant-current output circuits, provided for the n bits of the digital signal, for selectively generating n constant currents on the basis of the n bits of the digital signals. The n constant currents have mutually different current values with respect to the n bits of the digital signal. The constant-current output circuits have resistance elements respectively provided for the n bits of the digital signal. The resistance elements define the mutually different current values. The D/A converter also includes an output circuit for adding the n constant currents to each other and for outputting the analog signal based on an addition result, and a temperature-dependent voltage generating part for generating a temperature-dependent voltage which changes as a temperature around the D/A converter changes. Further, the D/A converter includes a current compensation part for generating a compensation voltage related to at least one of the resistance elements from the temperature-dependent voltage and for applying the compensation voltage to the one of the resistance elements. The compensation voltage compensates for a temperature-dependent variation in a characteristic of the one of the resistance elements.

20 Claims, 6 Drawing Sheets

DIGITAL-TO-ANALOG CONVERTER HAVING A CIRCUIT FOR COMPENSATING FOR VARIATION IN OUTPUT DEPENDENT ON TEMPERATURE CHANGE

BACKGROUND OF THE INVENTION

The present invention generally relates to digital-to-analog circuits, and more particularly to a digital-to-analog converter having a circuit which compensates for a variation in the analog output dependent on a temperature change.

Recently, digital-to-analog converters (hereafter simply referred to as D/A converters) have widely been used in various fields. For example, an electron beam exposure apparatus used in LSI production processes has a D/A converter which converts a digital signal representative of the deflection position of an electron beam into an analog signal. It is required that such an electron beam exposure apparatus be precisely formed in order to realize an increasing integration density of LSIs. Thus, it is necessary to provide a highly precise D/A converter for use in the electron beam exposure apparatus. Further, the image processing fields also need a highly precise D/A converter.

Figure 1:
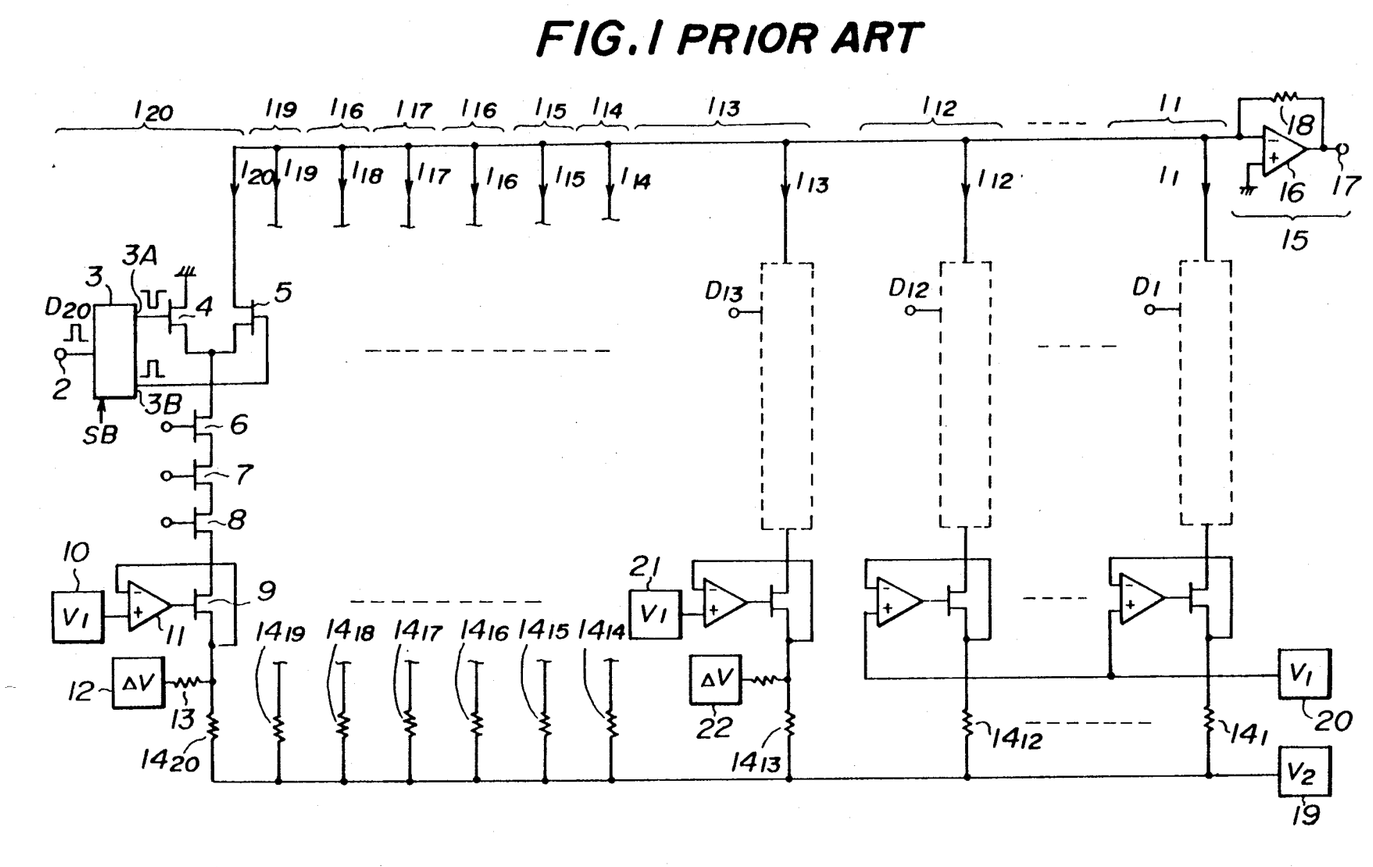
FIG. 1 is a circuit diagram of a conventional D/A converter of the current addition type.

FIG. 1 shows a conventional 20-bit D/A converter of a current addition type. The D/A converter shown in FIG. 1 has 20 constant-current output circuits $1_{20}$–$1_1$ respectively provided for 20 bits $D_{20}$–$D_1$ of a digital signal. The bit $D_{20}$ is the most significant bit (MSB), and the bit $D_1$ is the least significant bit (LSB). For the sake of simplicity, the entire configuration of only the constant-current output circuit $1_{20}$ is illustrated in FIG. 1.

The constant-current output circuit $1_{20}$ is made up of a digital signal input terminal 2, a current switching signal generation circuit 3, n-channel MOS (Metal Oxide Semiconductor) transistors (hereafter referred to as nMOS transistors) 4–9, a constant-voltage source 10, an operational amplifier 11, a correction power source 12 and resistors 13 and $14_{20}$. The digital signal input terminal 2 is connected to an input terminal of the current switching signal generation circuit 3.

The current switching signal generation circuit 3 inputs the digital signal $D_{20}$ in response to a strobe signal generated by an external circuit (not shown), outputs a signal having a phase opposite to that of the digital signal $D_{20}$ to an inverting output terminal 3A, and outputs a signal in phase with the digital signal $D_{20}$ to a non-inverting output terminal 3B. The inverting output terminal 3A is connected to the nMOS transistor 4, and the non-inverting output terminal 3B is connected to the gate of the nMOS transistor 5.

The nMOS transistors 4 and 5 function as a current switching circuit formed of a differential circuit. The drain of the nMOS transistor 4 is grounded, and the source thereof is connected to the source of the nMOS transistor 5 and the drain of the nMOS transistor 6. The drain of the nMOS transistor 6 is connected to an inverting input terminal of an operational amplifier 16, which has a non-inverting input terminal grounded and an output terminal connected to an analog signal output terminal 17. The output terminal of the operational amplifier 16 is also coupled to the inverting input terminal of the operational amplifier 16 through a resistor 18.

The nMOS transistors 6, 7 and 8 are connected so that they form a totem pole structure, and function to stabilize the source voltages of the nMOS transistors 4 and 5. The source of the lowermost nMOS transistor 8 is connected to the drain of the nMOS transistor 9. The gates of the nMOS transistors 6, 7 and 8 are provided with respective predetermined D.C. voltages.

The constant-voltage source 10 forms a constant-current source together with the operational amplifier 11, the nMOS transistor 9, the resistor $14_{20}$ and the constant-voltage source 19, and outputs a first constant voltage V1 necessary to form the constant current source. The constant-voltage source 10 has an output terminal connected to the non-inverting input terminal of the operational amplifier 11, which has an output terminal connected to the gate of the nMOS transistor 9. The source of the nMOS transistor 9 is connected to the inverting input terminal of the operational amplifier 11, and is coupled to an output terminal of the constant-voltage source 19 via the resistor $14_{20}$. The constant-voltage source 19 generates a second constant voltage V2 (<V1) necessary to form the constant-current source, and is provided in common for the constant-current output circuits $1_{20}$–$1_1$.

Assuming that the resistor $14_{20}$ has a resistance $R_{20}$, a current defined as $(V1-V2)/R_{20}$ passes through the resistor $14_{20}$. When the digital signal $D_{20}$ applied to the digital signal input terminal 2 has a high level "H", the nMOS transistor 4 is turned OFF, and the nMOS transistor 5 is turned ON, so that an output current $I_{20}$ of the constant-current output circuit $1_{20}$ is such that $I_{20}=(V1-V2)/R$. On the other hand, when the digital signal $D_{20}$ has a low level "L", the nMOS transistor 4 is turned ON, and the nMOS transistor 5 is turned OFF, so that the output current $I_{20}$ of the constant-current output circuit $1_{20}$ is such that $I_{20}=0$.

The correction voltage source 12 generates a correction voltage $\Delta V$ necessary to precisely calibrate the current passing through the resistor $14_{20}$, that is, the output current $I_{20}$ of the constant-current output circuit $1_{20}$. An output terminal of the correction voltage source 12 is coupled to one end of the resistor $14_{20}$ via the resistor 13.

The constant-current output circuits $1_{19}$–$1_{13}$ are configured in the same way as the constant-current output circuit $1_{20}$ except the resistance values of the resistors $14_{19}$–$14_{13}$. The constant-current output circuits $1_{12}$–$1_1$ are configured in the same way as the constant-current output circuit $1_{20}$ except that the single constant-voltage source 20 generating the first voltage V1 is provided in common and the resistors $14_{12}$–$14_1$ (not shown for the same of simplicity) have different resistance values.

Assuming that the resistance value of the resistor $14_1$ is denoted by $R_E$, the resistance values of the resistors $14_{20}$, $14_{19}$, ..., $14_1$ are written as, $(\frac{1}{2}^{19})R_E$, $(\frac{1}{2}^{18})R_E$, ..., $R_E$, respectively. That is, the amounts of the currents $I_{20}$, $I_{19}$, ..., $I_1$ are calibrated so that the amounts of the currents $I_{20}$, $I_{19}$, ..., $I_1$ are equal to $2^{19} \times I_0$, $2^{18} \times I_0$, ..., $I_0$ where $I_0$ denotes the current value of the output current $I_1$ of the constant-current output circuit $1_1$. With the above-mentioned arrangement, the analog signal output by the D/A converter can has a linear characteristic.

However, it is actually difficult to require the precision of the resistors $14_{20}$–$14_1$ enough to realize the complete linearity. That is, there is a deviation of the resistance value from the designed value. Particularly, since the resistors $14_{20}$–$14_{13}$ of the constant-current output circuits $1_{20}$–$1_{13}$ have small resistance values, the deviations of the resistance values of these resistors greatly affect the linearity of the D/A conversion characteristic.

With the above in mind, the D/A converter shown in FIG. 1 is independently equipped with the constant-voltage sources (only sources 10 and 21 are illustrated in FIG. 1) generating the first constant voltages V1 and the correction voltage sources (only sources 12 and 22 are illustrated) generating correction voltages $\Delta V$. First, the first constant voltages V1 with respect to the constant-current circuits $1_{20}$–$1_{13}$ are adjusted so that the currents $I_{20}, I_{19}, \ldots, I_{13}$ are equal to $2^{19} \times I_0, 2^{18} \times I_0, \ldots, 2^{12} \times I_0$, respectively. Second, if there is still an error in the linearity, the correction voltages $\Delta V$ are slightly adjusted so that the complete linearity can be obtained.

However, the experiments and study by the inventors show a possibility that even if the currents $I_{20}$–$I_{13}$ are calibrated by the above-mentioned procedures, the linearity is destroyed due to a temperature change. In order to obtain a required precision for 20 bits, it is necessary to ensure a precision of $10^{-6} \Omega/°C$. or less. Even if a resistor having a small temperature coefficient equal to, for example, $10^{-6} \Omega/°C$. in order to obtain the above-mentioned precision, the tolerable temperature change is only 1° C. Such a tolerable temperature change does not establish the stable linearity.

SUMMARY OF THE INVENTION

It is a general object of the present invention to provide an improved D/A converter in which the above-mentioned disadvantages are eliminated.

A more specific object of the present invention is to provide a highly precise D/A converter which has the stable linearity irrespective of a temperature change.

The above objects of the present invention are achieved by a D/A converter converting a digital signal having n bits (n is an integer) into an analog signal, the D/A converter comprising:

constant-current generating means, provided for the n bits of the digital signal, for selectively generating n constant currents on the basis of the n bits of the digital signals, the n constant currents having mutually different current values with respect to the n bits of the digital signal, the constant-current generating means having resistance elements respectively provided for the n bits of the digital signal, the resistance elements defining the mutually different current values;

outputting means, coupled to the constant-current generating means, for adding the n constant currents to each other and for outputting the analog signal based on an addition result;

temperature-dependent voltage generating means for generating a temperature-dependent voltage which changes as a temperature around the D/A converter changes; and current compensation means, coupled to the constant-current generating means and the temperature-dependent voltage generating means, for generating a compensation voltage related to at least one of the resistance elements from the temperature-dependent voltage and for applying the compensation voltage to the one of the resistance elements, the compensation voltage compensating for a temperature-dependent variation in a characteristic of the one of the resistance elements.

The above-mentioned objects of the present invention are also achieved by a D/A converter converting a digital signal having n bits (n is an integer) into an analog signal, the D/A converter comprising:

n constant-voltage generating means having constant-voltage sources respectively provided for the n bits of the digital signal and generating n constant voltages, for selectively connecting the constant-voltage sources in series on the basis of the n bits of the digital signal so that the analog signal is developed across a series circuit having none or at least one of the constant-voltage sources, the n constant voltages having mutually different voltage values with respect to the n bits of the digital signal;

temperature-dependent voltage generating means for generating a temperature-dependent voltage which changes as a temperature around the D/A converter changes; and voltage compensation means, coupled to the constant-voltage generating means and the temperature-dependent voltage generating means, for generating a compensation voltage related to at least one of the constant-voltage sources from the temperature-dependent voltage and for applying the compensation voltage to the one of the constant-voltage sources, the compensation voltage compensating for a temperature-dependent variation in a characteristic of the one of the constant-voltage sources.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 2:
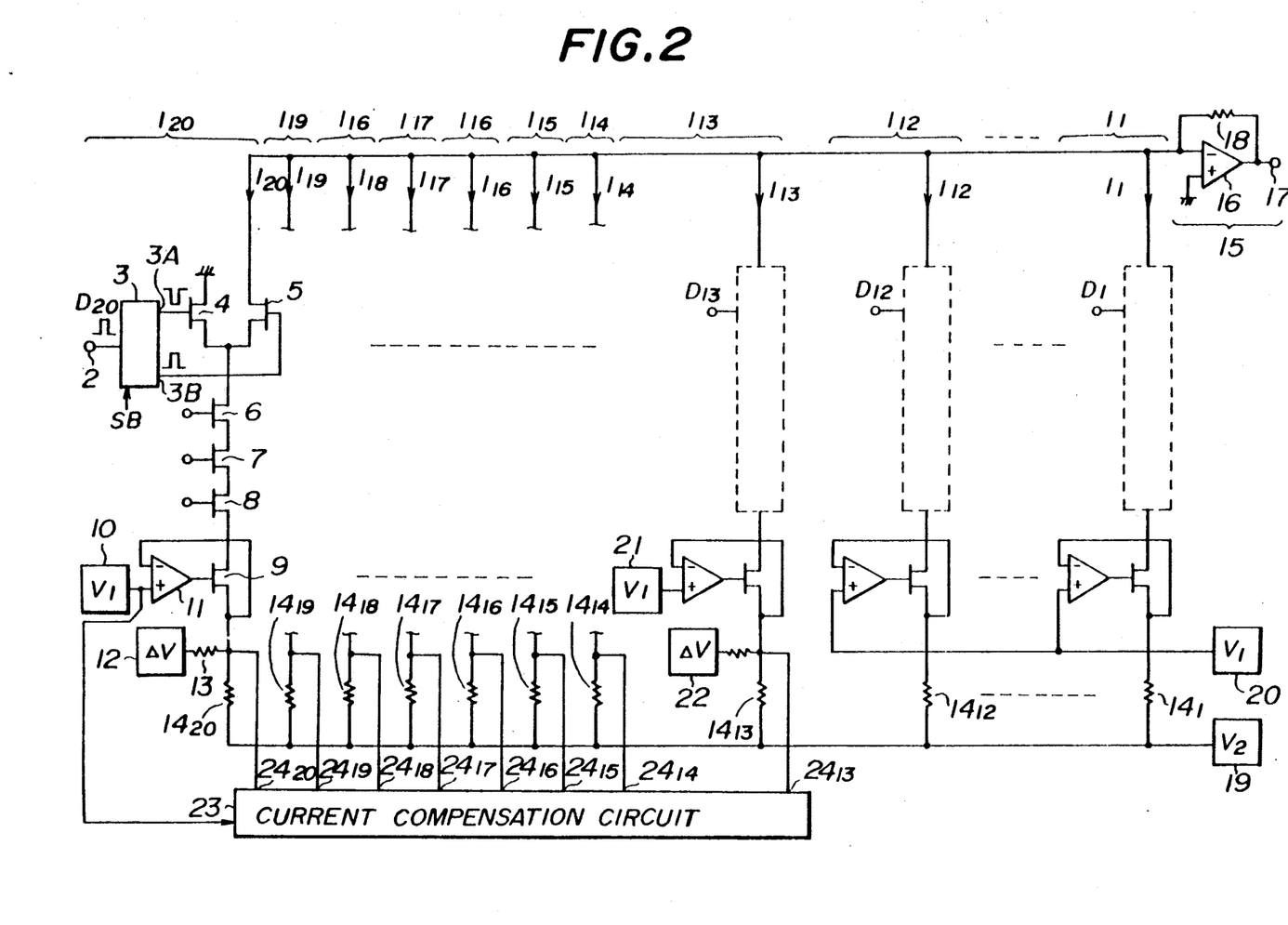
FIG. 2 is a circuit diagram illustrating an outline of a D/A converter according to a first preferred embodiment of the present invention.

FIG. 2 shows the outline of the D/A converter according to the first preferred embodiment of the present invention. In FIG. 2, those parts which are the same as those shown in FIG. 1 are given the same reference numerals. A current compensation circuit 23 is provided for the constant-current output circuits $1_{20}$–$1_{13}$ which have the respective constant-voltage sources such as sources 10 and 21. The current compensation circuit 23 has output terminals $24_{20}$–$24_{13}$, which are connected to the ends of the resistors $14_{20}$–$14_{13}$ different from the ends thereof set equal to the voltage V2. The current compensation circuit 23 compensates for changes in the currents passing through the resistors $14_{20}$–$14_{13}$, that is, the output currents $I_{20}$–$I_{13}$ of the constant-current output circuit $1_{20}$–$1_{13}$.

Figure 3:
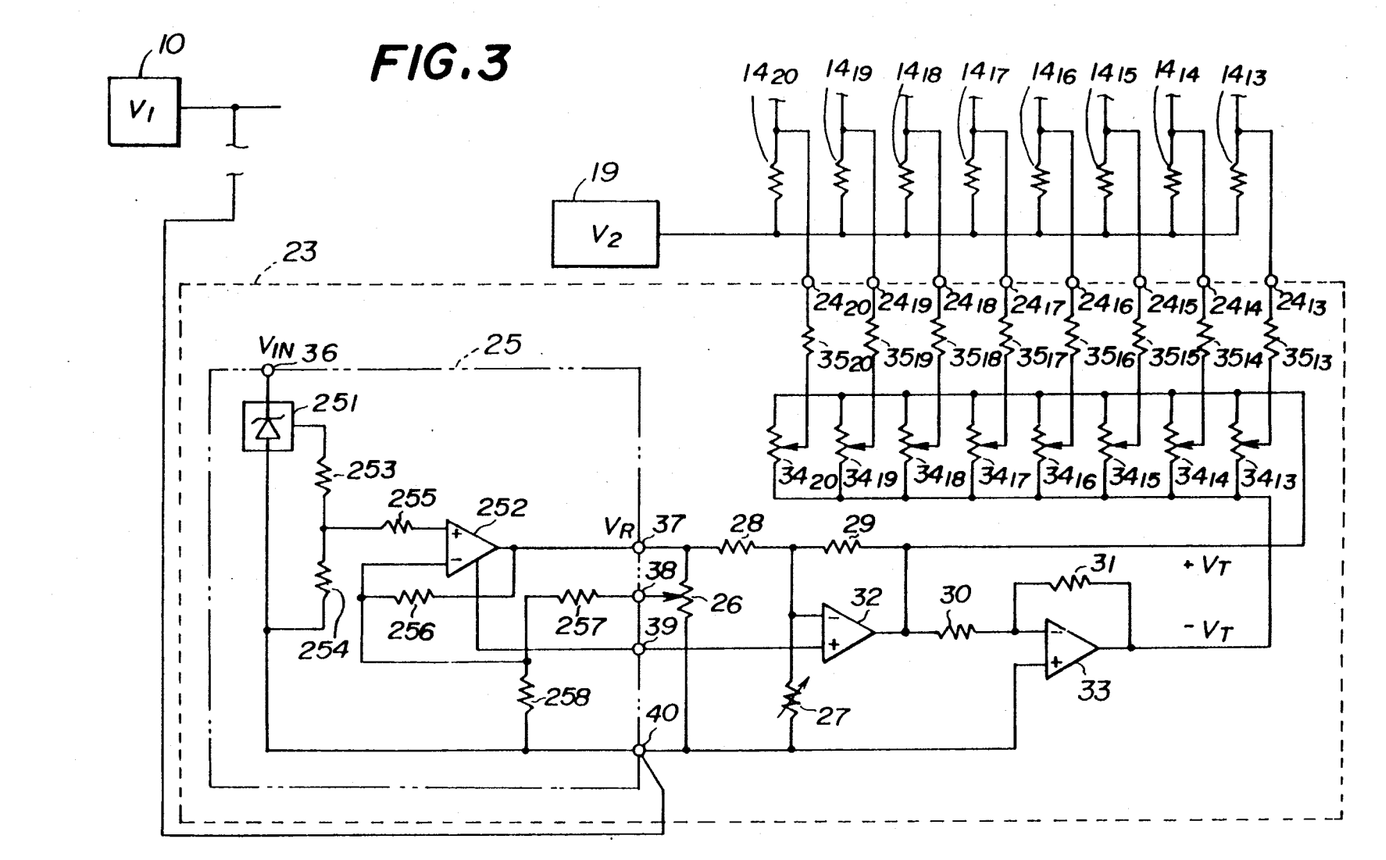
FIG. 3 is a circuit diagram illustrating the D/A converter shown in FIG. 2 in more detail.

Referring to FIG. 3, the current compensation circuit 23 is composed of a reference voltage generation circuit 25, variable resistors 26 and 27, resistors 28–31, operational amplifiers 32 and 33, variable resistors $34_{20}$–$34_{13}$, and resistors $35_{20}$–$35_{13}$.

The reference voltage generation circuit 25 is formed of, for example, ADREF02 manufactured by ANALOG DEVICES, which also functions as a temperature transducer. The reference voltage generation circuit 25 has a voltage input terminal 36, a reference voltage output terminal 37, a trim terminal 38, a temperature proportional voltage output terminal 39 and a base voltage terminal 40. A suitable input voltage $V_{IN}$ generated by an external circuit (not shown) is applied to the voltage input terminal 36. A reference voltage $V_R$ is output to the reference voltage output terminal 37. An adjustment voltage for adjusting the reference voltage $V_R$ is output to the trim terminal 38. A voltage proportional to temperature is output to the voltage output terminal 39. The base voltage terminal 40 is set to, for example, the constant voltage V1 generated and output by the constant-voltage source 10. Further, the reference voltage generation circuit 25 has a temperature sensitive element 251 such as a thermistor, an operational amplifier 252, and resistors 253–258. A voltage indicative of the temperature measured by the temperature sensitive element 251 is applied to a non-inverting input terminal of the operational amplifier 252 via the resistors 253–255. An output terminal of the operational amplifier 252 outputs the reference voltage $V_R$. Further, the output terminal of the operational amplifier 252 is coupled to an inverting input terminal thereof via the resistor 256. The voltage of the inverting input terminal of the operational amplifier 252 is voltage-divided by the resistors 257 and 258, and a voltage-divided voltage is applied to the trim terminal 38.

The reference voltage output terminal 37 is connected to one stationary contact of the variable resistor 26, the other stationary contact of which is set to the base voltage V1. A movable contact of the variable resistor 26 is connected to the trim terminal 38. The reference voltage output terminal 37 is coupled to an inverting input terminal of the operational amplifier 32 through the resistor 28. The operational amplifier 32 functions as an amplifier. A non-inverting input terminal of the operational amplifier 32 is connected to the temperature proportional voltage output terminal 39 of the reference voltage generation circuit 25. An output terminal of the operational amplifier 32 is coupled, via the resistor 29, to the inverting terminal thereof, which is connected to the base terminal 40 via the variable resistor 27.

The variable resistor 26 is used for adjusting an offset voltage between the voltages $+V_T$ and $-V_T$ so that the offset voltage is zero volt. The variable resistor 27 is used for adjusting the gain of the voltages $+V_T$ and $-V_T$.

The output terminal of the operational amplifier 32 is connected to stationary contacts of the variable resistors $34_{20}$–$34_{13}$ on one side thereof, and also connected to an inverting input terminal of the operational amplifier 33 via the resistor 30. The operational amplifier 33 functions as an inverter. A non-inverting input terminal of the operational amplifier 33 is connected to the base voltage terminal 40, and an inverting input terminal thereof is connected to an output terminal thereof through the resistor 31. The output terminal of the operational amplifier 33 is connected to stationary contacts of the variable resistors $34_{20}$–$34_{13}$ on the other side thereof. Each of the variable resistors $34_{20}$–$34_{13}$ determines a current range to be compensated for.

Movable contacts of the variable resistors $34_{20}$–$34_{13}$ are coupled to the ends of the resistors $14_{20}$–$14_{13}$ via the resistors $35_{20}$–$35_{13}$ and the output terminals $24_{20}$–$24_{13}$, respectively.

The operational amplifier 32 outputs a positive voltage $+V_T$ to its output terminal, and the operational amplifier 33 outputs a negative voltage $-V_T$ to its output terminal. The absolute values of the positive and negative voltage $+V_T$ and $-V_T$ are identical to each other, and substantially linearly change as the temperature changes. Thus, by adjusting the movable contact of each of the variable resistors $34_{20}$–$34_{13}$, it is possible to apply an arbitrary voltage between $-V_T$ and $+V_T$ to the end of each of the resistors $14_{20}$–$14_{13}$.

The adjustment of the D/A converter according to the first embodiment of the present invention is carried out as follows. First, the variable resistor 26 is adjusted at a temperature (reference temperature) so that the input voltage applied to the inverting input terminal of the operational amplifier 32 and the non-inverting input terminal thereof become equal to each other. In this case, the output voltage $+V_T$ of the operational amplifier 32 is zero volt, and thus the output voltage $-V_T$ of the operational amplifier 33 is also zero volt. That is, the correction voltage applied to the resistors $14_{20}$–$14_{13}$ is zero volt.

Next, the first voltage V1 and the correction voltage $\Delta V$ related to each of the constant-current output circuit $1_{20}$–$1_{13}$ are adjusted so that the output currents $I_{20}$, $I_{19}$, ..., $I_{13}$ become equal to $2^{19} \times I_0$, $2^{18} \times I_0$, ..., $2^{12} \times I_0$, respectively. As a result, the linearity of the D/A conversion can be established at the reference temperature. For example, the D/A converter shown in FIG. 2 has a precision of 1 ppm/10° C. or less, whereas the D/A converter has a precision of approximately 10 ppm/1° C.

Then, the temperature around the D/A converter is changed, and the output currents $I_{20}$–$I_{13}$ are measured at a changed temperature. When the measured amounts of the currents $I_{20}$–$I_{13}$ obtained at the changed temperature are different from those of the currents $I_{20}$–$I_{13}$ obtained at the reference temperature, the variable resistors $34_{20}$–$34_{13}$ are adjusted so that the output currents $I_{20}$, $I_{19}$, ..., $I_{13}$ become equal to $2^{19} \times I_0$, $2^{18} \times I_0$, ..., $2^{12} \times I_0$, respectively. It is preferable that the above-mentioned adjustment be carried out at a plurality of temperatures. With the above-mentioned arrangement, it becomes possible to establish the linearity of the D/A conversion irrespective of the ambient temperature of the D/A converter and thus generate highly precise analog signals. During the operation, the gain of the voltages $+V_T$ and $-V_T$ can be adjusted by the variable resistor 27.

In the above-mentioned first embodiment of the present invention, the current compensation is carried out for the output currents $I_{20}$–$I_{13}$. However, it is possible to carry out the current compensation for an arbitrary number of output currents. For example, it is possible to carry out the current compensation for all the output currents $I_{20}$–$I_0$. In this case, the temperature dependency of the D/A conversion characteristic is less than that of the D/A converter shown in FIG. 2.

It is also possible to equip each of the current output circuits $1_{20}$–$1_{13}$ with the current compensation circuit. In this arrangement, the current compensation circuit provided for each of the current output circuit $1_{20}$–$1_{13}$ has the reference voltage generation circuit 25, the operational amplifiers 32 and 33, the variable resistors 26 and 27, the resistors 28-31, and one of the variable resistors $34_{20}$–$34_{13}$ and one of the resistors $35_{20}$–$35_{13}$. The present invention also includes a D/A converter having two or more constant-current output circuits for each high-order bit (for example, $D_{20}$–$D_{13}$).

Each of the variable resistors $34_{20}$–$34_{13}$ has a resistance in the order of, for example, $10^3$–$10^4$ ohms. Similarly, each of the resistors $35_{20}$–$35_{13}$ has a resistance in the order of, for example, $10^3$–$10^4$ ohms. It should be noted that the number of bits of the digital signal to be compensated for is determined based on how precisely the analog signals should be generated.

Figure 4:
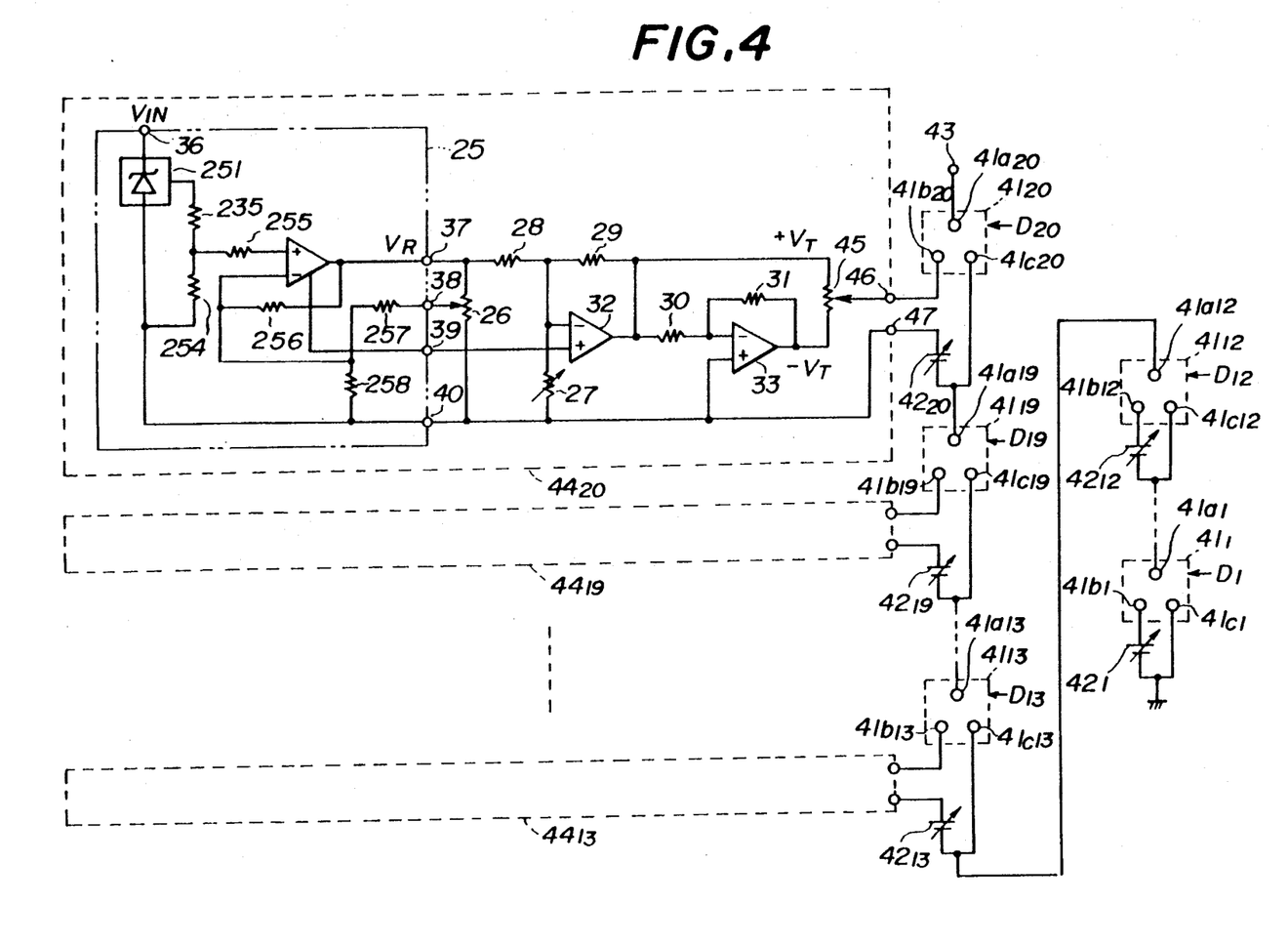
FIG. 4 is a circuit diagram of a D/A converter according to a second preferred embodiment of the present invention.

A description will now be given of a D/A converter according to a second preferred embodiment of the present invention with reference to FIG. 4, in which those parts which are the same as those shown in the previous figures are given the same reference numerals. The D/A converter shown in FIG. 4 is a voltage addition type the D/A converter. The D/A converter in FIG. 4 has 20 switching circuits $41_{20}$–$41_1$ (only switching circuits $41_{20}$, $41_{19}$, $41_{13}$, $41_{12}$ and $41_1$ are shown), and 20 constant-voltage sources $42_{20}$–$42_1$ (only constant-voltage sources $42_{20}$, $42_{19}$, $42_{12}$ and $42_1$ are shown) with respect to the 20 digital signal $D_{20}$–$D_1$ (only digital signals $D_{20}$, $D_{19}$, $D_{13}$, $D_{12}$ and $D_1$ are shown), respectively.

The switching circuits $41_{20}$–$41_1$ are controlled by the digital signals $D_{20}$–$D_1$, respectively. When the digital signals $D_{20}$–$D_1$ are maintained at the high level, movable contacts $41a_{20}$–$41a_1$ of the switching circuits $41_{20}$–$41_1$ are connected to stationary contacts $41b_{20}$–$41b_1$. On the other hand, when the digital signals $D_{20}$–$D_1$ are maintained at the low level, movable contacts $41a_{20}$–$41a_1$ of the switching circuits $41_{20}$–$41_1$ are connected on stationary contacts $41c_{20}$–$41c_1$. The constant-voltage sources $42_{20}$, $42_{19}$, ..., $42_1$ are adjustable so that they output $2^{19} \times E_0$, $2^{18} \times E_0$, ....., $E_0$, respectively, where $E_0$ is the output voltage of the constant-voltage source $42_1$.

Voltage compensation circuits $44_{20}$–$44_{13}$ (only $44_{20}$, $44_{19}$ and $44_{13}$ are shown) are provided for the constant-voltage sources $42_{20}$–$42_{13}$, respectively. The voltage compensation circuits $44_{20}$–$44_{13}$ function to compensate for variations in the output voltages of the constant-voltage sources $42_{20}$–$42_{13}$ arising from temperature changes.

The voltage compensation circuit $44_{20}$ has a variable resistor 45 in addition to the aforementioned reference voltage generation circuit 25, the variable resistors 26 and 27, the resistors 28-31 and the operational amplifiers 32 and 33. The output terminal of the operational amplifier 32 is connected to one stationary contact of the variable resistor 45, and the output terminal of the operational amplifier 33 is connected to the other stationary contact of the variable resistor 45. The movable contact of the variable resistor 45 is connected to an output terminal 46 of the voltage compensation circuit $44_{20}$. The base voltage terminal 40 of the reference voltage generation circuit 25 is connected to an output terminal 47 of the voltage compensation circuit $44_{20}$. The other arrangements of the voltage compensation circuit $44_{20}$ are the same as those of the current compensation circuit 23 shown in FIG. 3. The output terminals 46 and 47 are connected to the stationary contact $41b_{20}$ of the switching circuit 41 and the positive voltage output terminal of the constant-voltage source $42_{20}$.

The positive voltage $+V_T$ is obtained at the output terminal of the operational amplifier 32, and the negative voltage $-V_T$ is obtained at the output terminal of the operational amplifier 33. The positive and negative voltages $+V_T$ and $-V_T$ change substantially linearly as the temperature changes, and the absolute values thereof are identical to each other. By adjusting the movable contact of the variable resistor 45, the compensation voltage between $-V_T$ and $+V_T$ is generated between the output terminals 46 and 47 (added to the constant voltage of the constant-voltage source $42_{20}$), and compensates for variations in the output voltage of the constant-voltage source $42_{20}$ arising from temperature variations.

The other voltage compensation circuits $44_{19}$–$44_{13}$ are formed in the same way as the voltage compensation circuit $44_{19}$–$44_{13}$, and the variations in the output voltages of the constant-voltage sources $42_{19}$–$42_{13}$ can be compensated for.

The adjustment is actually carried out as follows. First, the variable resistor 26 is adjusted at a temperature (reference temperature) so that the inverting input terminal of the operational amplifier 32 has an input voltage identical to that of the non-inverting input terminal thereof. In this case, the output voltage $+V_T$ of the operational amplifier 32 is zero volt, and thus, the output voltage of the operational amplifier 33 is also zero volt. That is, the correction voltage with respect to the constant-voltage source $42_{20}$ is set equal to zero volt.

Second, the constant-voltage sources $42_{20}$–$42_{13}$ are adjusted in the above state is that the output voltages thereof become equal to $2^{19} \times E_0$, $2^{18} \times E_0$, ..., $2^{12} \times E$, respectively. As a result, the linearity of the D/A conversion at the reference temperature can be established.

Third, the ambient temperature around the D/A converter is changed to a temperature, and the voltage of the constant-voltage source $42_{20}$ is measured at the changed temperature. If the measured voltage of the constant-voltage source $42_{20}$ is different from that obtained at the original temperature, the variable resistor 45 is adjusted so that the output voltage of the constant-voltage source $42_{20}$ becomes equal to $2^{19} \times E_0$. It is preferable that this adjustment be carried out at a plurality of temperatures. The above-mentioned adjustment is carried out for each of the constant-voltage sources $42_{19}$–$42_{13}$. In this way, it becomes possible to compensate for the variations in the output voltages of the constant-voltage sources $42_{19}42_{13}$ arising from temperature changes in the range between $-V_T$ and $+V_T$. During the operation, the gain of the voltages $+V_T$ and $-V_T$ can be adjusted by the variable resistor 27.

According to the second preferred embodiment of the present invention, it becomes possible to generate highly precise linear analog signals immune to temperature variations. It will be noted that the voltage compensation circuits $44_{20}$–$44_1$ can be applied to another basic configuration of the voltage addition D/A converter. For example, the present invention includes a D/A converter in which a plurality of constant-voltage sources are provided for each high-order bit (for example $D_{20}$–$D_{13}$). It is also possible to provide voltage compensation circuits for all the digital signals $D_{20}$–$D_0$. In this case, the D/A conversion precision will higher than that of the D/A converter shown in FIG. 4.

Figure 5A:
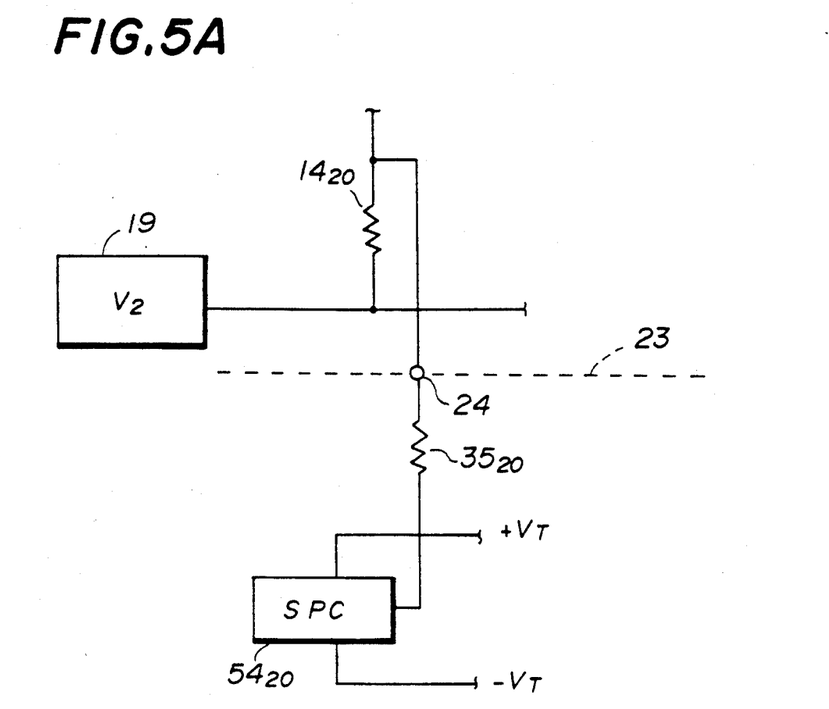
FIG. 5A is a circuit diagram of a D/A converter according to a third preferred embodiment of the present invention.
Figure 5B:
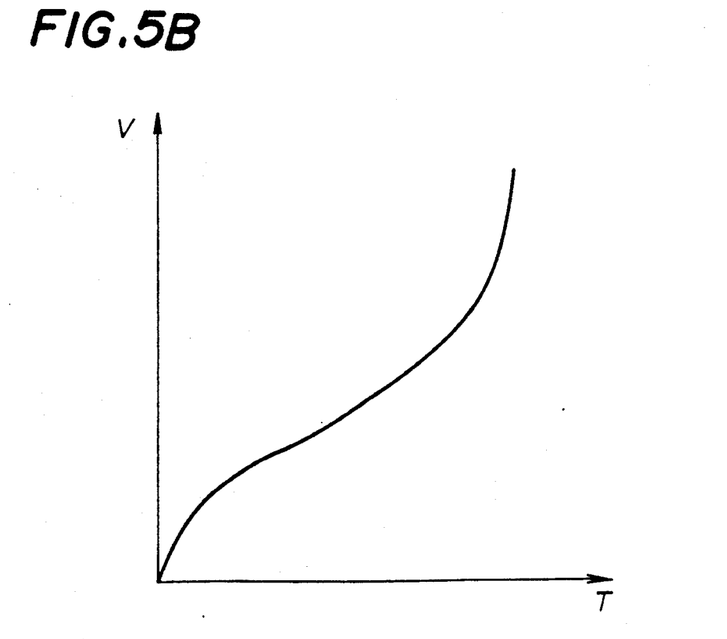
FIG. 5B is a graph showing the operation of a signal processing circuit shown in FIG. 5A.

FIG. 5A is a circuit diagram which partially shows the structure of a D/A converter according to a third preferred embodiment of the present invention. In FIG. 5A, those parts which are the same as those shown in FIG. 3 are given the same reference numerals. The variable resistors $34_{20}$–$34_{13}$ are replaced by signal processing circuits (SPC: only signal processing circuit $54_{20}$ related to the digital signal $D_{20}$ is illustrated in FIG. 5A). The signal processing circuit $54_{20}$ receives the voltages $+V_T$ and $-V_T$, and outputs a compensation voltage as a function of temperature T, as shown in FIG. 5B. The temperature of the origin of the graph is the aforementioned reference temperature. The temperature T is indicated by the voltages $+V_T$ and $-V_T$. As has been described previously, the voltages $+V_T$ and $-V_T$ linearly change as the temperature changes. As shown in FIG. 5B, the relationship between the compensation voltage V and the temperature T related to the signal processing circuit $54_{20}$, which is not linear, corresponds to the temperature characteristic of the resistor $14_{20}$. For example, the signal processing circuit $54_{20}$ includes a read only memory and an address circuit. The address circuit generates a digital address signal corresponding to the voltages $+V_T$ and $-V_T$. The address signal is applied to the ROM, from which a corresponding compensation voltage is read out.

Figure 6:
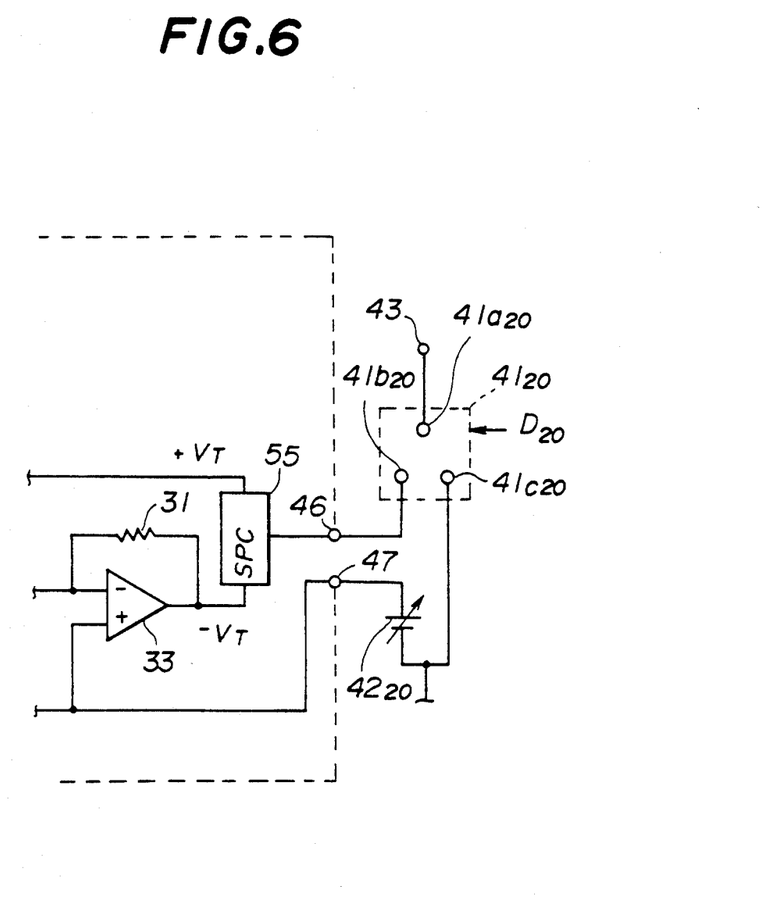
FIG. 6 is a circuit diagram of a fourth preferred embodiment of the present invention.

FIG. 6 shows a fourth preferred embodiment of the present invention. In FIG. 6, those parts which are the same as those shown in FIGS. 4 and 5A are given the same reference numerals. The resistor 45 shown in FIG. 4 is replaced by a signal processing circuit 55. The signal processing circuit 55 receives the voltages $+V_T$ and $-V_T$ indicative of temperature change, and generates a corresponding compensation voltage based on the temperature characteristic of the variable constant-voltage source $42_{20}$.

The present invention is not limited to the specifically disclosed embodiments, and variations and modifications may be made without departing from the scope of the present invention.

What is claimed is:

1. A D/A converter converting a digital signal having n bits into an analog signal, wherein n is an integer, said D/A converter comprising:
   constant-current generating means, provided for the n bits of said digital signal, for selectively generating n constant currents based on the n bits of said digital signal, said n constant currents having mutually different current values with respect to the n bits of said digital signal, said constant-current generating means having resistance elements respectively provided for the n bits of said digital signal, said resistance elements defining said mutually different current values;
   outputting means, coupled to said constant-current generating means, for adding said n constant currents to each other and for outputting said analog signal based on an addition result;
   temperature-dependent voltage generating means for generating a temperature-dependent voltage which changes as a temperature around said D/A converter changes; and
   current compensation means, coupled to said constant-current generating means and said temperature-dependent voltage generating means, for generating a compensation voltage, related to at least one of said resistance elements, from said temperature-dependent voltage and for applying said compensation voltage to said one of said resistance elements, said compensation voltage compensating for a temperature-dependent variation in a characteristic of said one of said resistance elements, wherein said current compensation means generates compensation voltages related to predetermined resistance elements among said resistance elements.

2. A D/A converter as claimed in claim 1, wherein:
   said temperature-dependent voltage generating means comprises means for generating a first voltage and a second voltage, both of which correspond to said temperature-dependent voltage;
   said first and second voltages have opposite polarities, and an absolute value of said first voltage is equal to that of said second voltage;
   said current compensation means comprises means for generating said compensation voltage which is between said first voltage and said second voltage and which cancels a temperature-dependent error in a corresponding one of said constant currents.

3. A D/A converter converting a digital signal having n bits into an analog signal, wherein n is an integer, said D/A converter comprising:
   constant-current generating means, provided for the n bits of said digital signal, for selectively generating n constant currents based on the n bits of said digital signal, said n constant currents having mutually different current values with respect to the n bits of said digital signal, said constant-current generating means having resistance elements respectively provided for the n bits of said digital signal, said resistance elements defining said mutually different current values;
   outputting means, coupled to said constant-current generating means, for adding said n constant currents to each other and for outputting said analog signal based on an addition result;
   temperature-dependent voltages generating means for generating a temperature-dependent voltage which changes as a temperature around said D/A converter changes;
   current compensation means, coupled to said constant-current generating means and said temperature-dependent voltage generating means, for generating a compensation voltage, related to at least one of said resistance elements, from said temperature-dependent voltage and for applying said compensation voltage to said one of said resistance elements, said compensation voltage compensating for a temperature-dependent variation in a characteristic of said one of said resistance elements;
   said temperature-dependent voltage generating means comprises means for generating a first voltage and a second voltage which correspond to said temperature-dependent voltage;
   said first and second voltages have opposite polarities, and an absolute value of said first voltage is equal to an absolute value of said second voltage;
   said current compensation means comprises a variable resistor related to said one of said resistance elements; and
   said variable resistor has a first stational contact connectable to receive said first voltage, a second stational contact connectable to receive said second voltage, and a third movable contact connected to one end of said one of said resistance elements, so that said compensation voltage which is obtained at said third movable contact and which is a voltage between said first voltage and said second voltage is applied to said end of said one of the resistance elements.

4. A D/A converter as claimed in claim 3, wherein said temperature-dependent voltage generating means comprises:

reference voltage generating means for generating a reference voltage and a temperature proportion voltage;

first, second, third, fourth and fifth resistors;

said fifth resistor having a first contact connectable to receive said reference voltage via said first resistor, and a second contact connectable to receive a predetermined base voltage;

a first operational amplifier having a first input terminal connectable to receive said reference voltage through said first resistor, a second terminal connectable to receive said predetermined base voltage through said fifth resistor, and an output terminal coupled to said first terminal through said second resistor, said first voltage being output via said output terminal of said first operational amplifier; and a second operational amplifier having a first input terminal coupled to the output terminal of said first operational amplifier through said third resistor, a second input terminal connectable to receive said predetermined base voltage, and an output terminal coupled to said first input terminal of said second operational amplifier through said fourth resistor, said second voltage being output via said output terminal of said second operational amplifier.

5. A D/A converter as claimed in claim 4, wherein:

said reference voltage generating means comprises means for generating a reference voltage adjustment voltage; and said current compensation means comprises a variable resistor having a first stationary contact connectable to receive said reference voltage, a second stationary contact connectable to receive said predetermined base voltage, and a third movable contact connectable to receive said reference voltage adjustment voltage, said variable resistor being adjusted so that a temperature-dependent error in a corresponding one of said constant currents is canceled.

6. A D/A converter as claimed in claim 4, wherein said fifth resistor is a variable resistor which is adjusted so that a temperature-dependent error in a corresponding one of said constant currents is canceled.

7. A D/A converter as claimed in claim 3, wherein said current compensation means comprises a resistor provided between said third movable contact of said variable resistor and said one end of said corresponding one of the resistance elements.

8. A D/A converter as claimed in claim 1, wherein said one of said n bits of said digital signal is a most significant bit of said digital signal.

9. A D/A converter as claimed in claim 1, wherein said temperature-dependent voltage substantially linearly changes as the temperature around said D/A converter changes.

10. A D/A converter as claimed in claim 1, wherein said temperature-dependent voltage changes as the temperature around said D/A converter changes in accordance with a temperature characteristic of a corresponding one of said resistance elements.

11. A D/A converter as claimed in claim 1, wherein each of said n constant currents is zero when a corresponding one of the n bits of the digital signal has a predetermined binary value.

12. A D/A converter converting a digital signal having n bits into an analog signal, wherein n is an integer, said D/A converter comprising:

n constant-voltage generating means having constant-voltage sources respectively provided for the n bits of said digital signal and generating n constant voltages, for selectively connecting said constant-voltage sources in series based on the n bits of said digital signal so that said analog signal is developed across a series circuit having none or at least one of said constant-voltage sources, said n constant voltages having mutually different voltage values with respect to the n bits of said digital signal;

temperature-dependent voltage generating means for generating a temperature-dependent voltage which changes as a temperature around said D/A converter changes; and voltage compensation means, coupled to said constant-voltage generating means and said temperature-dependent voltage generating means, for generating a compensation voltage, related to at least one of said constant-voltage sources, from said temperature-dependent voltage and for applying said compensation voltage to said one of said constant-voltage sources, said compensation voltage compensating for a temperature-dependent variation in a characteristic of said one of said constant-voltage sources, wherein said voltage compensation means generates compensation voltages related to predetermined constant-voltage sources among said constant-voltage sources.

13. A D/A converter as claimed in claim 12, wherein:

said temperature-dependent voltage generating means comprises means for generating a first voltage and a second voltage which correspond to said temperature-dependent voltage;

said first and second voltages have opposite polarities, and an absolute value of said first voltage is equal to that of said second voltage;

said voltage compensation means comprises means for generating said compensation voltage which is between said first voltage and said second voltage and which cancels a temperature-dependent error in a corresponding one of said constant voltages.

14. A D/A converter converting a digital signal having n bits into an analog signal, wherein n is an integer, said D/A converter comprising:

n constant-voltage generating means having constant-voltage sources respectively provided for the n bits of said digital signal and generating n constant voltages, for selectively connecting said constant-voltage sources in series based on the n bits of said digital signal so that said analog signal is developed across a series circuit having none or at least one of said constant-voltage sources, said n constant voltages having mutually different voltage values with respect to the n bits of said digital signal;

temperature-dependent voltage generating means for generating a temperature-dependent voltage which changes as a temperature around said D/A converter changes;

voltage compensation means, coupled to said constant-voltage generating means and said temperature-dependent voltage generating means, for generating a compensation voltage, related to at least one of said constant-voltage sources, from said temperature-dependent voltage and for applying said compensation voltage to said one of said constant-voltage sources, said compensation voltage compensating for a temperature-dependent variation in a characteristic of said one of said constant-voltage sources, wherein said voltage compensation means generates compensation voltages related to predetermined constant-voltage sources among said constant-voltage sources;

said temperature-dependent voltage generating means comprises means for generating a first voltage and a second voltage, both of which correspond to said temperature-dependent voltage;

said first and second voltages have opposite polarities, and an absolute value of said first voltage is equal to an absolute value of said second voltage;

said voltage compensation means comprises a variable resistor related to said one of said constant-voltage sources; and said variable resistor has a first stational contact connectable to receive said first voltage, a second stational contact connectable to receive said second voltage, and a third movable contact coupled to said one of said constant-voltage sources, so that said compensation voltage which is obtained at said third movable contact and which is a voltage between said first voltage and said second voltage is applied to said end of said one of the constant-voltage sources.

15. A D/A Converter as claimed in claim 14, wherein said temperature-dependent voltage generating means comprises:

reference voltage generating means for generating a reference voltage and a temperature proportion voltage;

first, second, third, fourth and fifth resistors;

first and second output terminals provided in said series circuit;

said fifth resistor having a first contact connectable to receive said reference voltage via said first resistor, and a second contact connected to said second output terminal;

a first operational amplifier having a first input terminal connectable to receive said reference voltage through said first resistor, a second terminal coupled to said second output terminal through said fifth resistor, and an output terminal coupled to said first terminal through said second resistor, said first voltage being output via said output terminal of said first operational amplifier; and a second operational amplifier having a first input terminal coupled to the output terminal of said first operational amplifier through said third resistor, a second input terminal connected to said second output terminal, and an output terminal coupled to said first input terminal of said second operational amplifier through said fourth resistor, said second voltage being output via said output terminal of said second operational amplifier:

said first output terminal is connected to said third movable contact of said variable resistor; and said second output terminal is connected to one end of said corresponding one of the constant-voltage sources.

16. A D/A converter as claimed in claim 15, wherein:

said reference voltage generating means comprises means for generating a reference voltage adjustment voltage; and said voltage compensation means comprises a variable resistor having a first stationary contact connectable to receive said reference voltage, a second stationary contact connected to said second output terminal, and a third movable contact connectable to receive said reference voltage adjustment voltage, said variable resistor being adjusted so that a temperature-dependent error in a corresponding one of said constant voltages is canceled.

17. A D/A converter as claimed in claim 15, wherein said fifth resistor is a variable resistor which is adjusted so that a temperature-dependent error in a corresponding one of said constant voltages is canceled.

18. A D/A converter as claimed in claim 12, wherein said one of said n bits of said digital signal is a most significant bit of said digital signal.

19. A D/A converter as claimed in claim 12, wherein said temperature-dependent voltage substantially linearly changes as the temperature around said D/A converter changes.

20. A D/A converter as claimed in claim 12, wherein said temperature-dependent voltage changes as the temperature around said D/A converter changes in accordance with a temperature characteristic of a corresponding one of said constant-voltage sources.

* * * * *